(12) United States Patent
Yang

(10) Patent No.: US 6,894,538 B2
(45) Date of Patent: May 17, 2005

(54) EXPANDING MODULE FOR SERIAL TRANSMISSION

(75) Inventor: Chin-Yi Yang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 71 days.

(21) Appl. No.: 10/671,653

(22) Filed: Sep. 29, 2003

(65) Prior Publication Data

US 2005/0001654 A1 Jan. 6, 2005

(30) Foreign Application Priority Data

Jun. 20, 2003 (TW) .......................................... 92116850 A

(51) Int. Cl.[7] .......................................... H03K 19/0175
(52) U.S. Cl. ............................. 326/82; 326/83; 326/86; 326/90
(58) Field of Search ............................... 326/80–83, 86, 326/90

(56) References Cited

U.S. PATENT DOCUMENTS

2003/0184341 A1 * 10/2003 Krasnansky ................. 326/82

* cited by examiner

Primary Examiner—Anh Q. Tran

(57) ABSTRACT

An expanding module for serial transmission between a chip and a plurality of interface units is disclosed. The module is comprised of a plurality of first OR gates and a plurality of second OR gates, corresponding respectively to each interface unit, which logically evaluates the control signals and the data signals transmitted by the chip to the interface units, and an AND gate that logically judges the feedback data signals from the interface units to decide which interface unit is to communicate with the chip.

8 Claims, 2 Drawing Sheets

EXPANDING MODULE FOR SERIAL TRANSMISSION

BACKGROUND OF THE INVENTION

1. Field of Invention

The invention relates to a module for controlling and expanding serial transmission, especially a controlling and expanding module for serial data transmission between a chip and a plurality of interface units.

2. Related Art

Individual chips (such as CPUs) use interfacing integrated circuits (interfacing ICs) on serial interfaces and other devices to execute serial transmission. There are many types of serial interfaces, such as RS232, RS 485, etc; therefore, a chip usually needs to be connected to many interfacing ICs for practical purposes.

However, when a chip needs to be connected to more than two interfacing ICs, it needs more than two serial transmission ports, or a special expansion module to enable serial transmission. The current expansion modules are not only structurally complex, and also expensive to fabricate, and so raise the overall cost of the complete product.

Thus, it is very important to develop a simple and low cost controlling and expanding module for serial transmission.

SUMMARY OF THE INVENTION

The main purpose of the invention is to provide a module for controlling and expanding serial transmission by using simple logic gate calculations to allow a chip to transmit data with a plurality of serial interfaces.

To achieve the described goals, the module for controlling and expanding serial connections of the invention is comprised of a single chip, a plurality of interfacing units, a plurality of first OR gates corresponding to the interfacing units, a plurality of second OR gates corresponding to the interfacing units, and an AND gate. The chip transmits a low voltage data signal and a low voltage control signal to the chosen interfacing unit. The corresponding first OR gate of this interfacing unit receives the low voltage data signal and control. After logic calculations, the OR gate outputs a low voltage data signal to the interfacing unit and then the interfacing unit outputs a low voltage data signal to the second OR gate. The second OR gate receives the low voltage data signal and the low voltage control signal from the input end. After logic calculations, it feeds back a low voltage data signal to the AND gate and outputs the result to the chip for data transmission after the AND gate calculation.

Also, the control signal output by the chip can first be decoded by the decoder of the chip and then output to each of the first or second OR gates, to overcome the limitation of being unable to connect multiple interfacing units due to insufficient pins.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
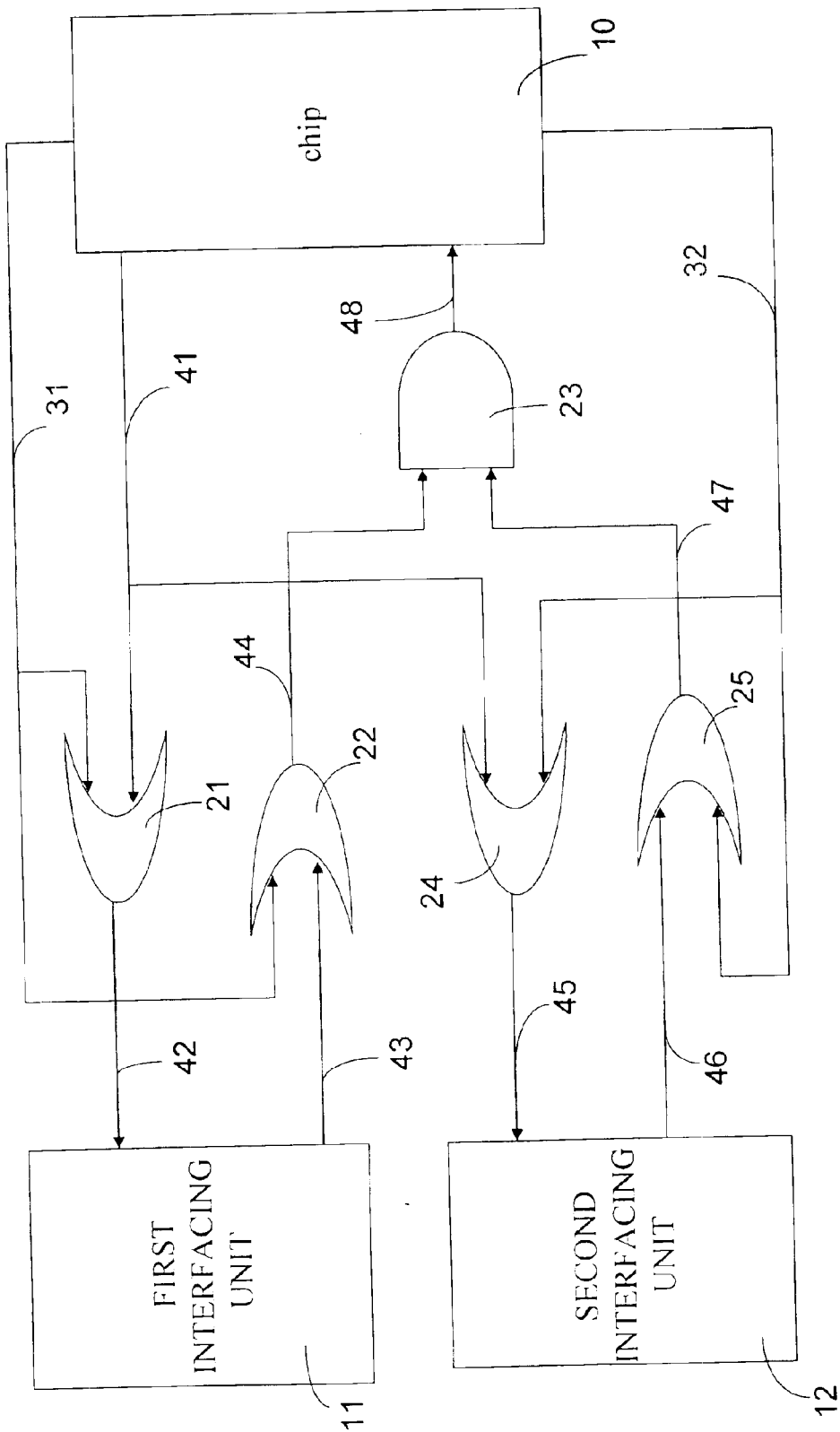
FIG. 1 illustrates the electrical circuits of the invention in block diagram form.

Please refer to FIG. 1 for the electrical circuit block diagram of the invention. As shown in the figure, the module for controlling and expanding serial transmission is comprised of the following connected components: a chip 10, a first interfacing unit 11, and a second interfacing unit 12. The chip 10 uses the outputted control and data signals to the serial transmission control and expansion module to control and determine which one of the interfacing units 11 and 12 is used for the data transmission session.

The chip 10 can be a central processing unit (CPU).

The interfacing units 11 and 12 are integrated circuits (IC) that are serial interfacing units converting from one transmission format or electric standards to another, including serial connections such as RS232, RS422, RS485, etc, serial to USB serial to parallel interface serial to Ethernet interface, etc.

The module for controlling and expanding serial transmission is comprised of the following components. A first OR gate 21, with its input connected to the chip 10 to receive control signals 31 and data signals 41 from the chip 10. The output of the OR gate is connected to the first interfacing unit 11. A second OR gate 22, with its input connected to the chip 10 and the first OR gate 11, to receive the control signals 31 from the chip and the outputted data signals 43 from the first OR gate; its output is fed back to the AND gate 23. A third OR gate 24, with its input connected to the chip 10, to receive the control signals 32 and data signals 41 from the chip 10; its output is connected to the second interfacing unit 12. A forth OR gate 25, with its input connected to the chip 10 and the second interfacing unit 12, to receive the control signals 32 from chip the 10 and data signals 46 from the second interfacing unit 12; its output is connected to the OR gate 23. An AND gate 23; the input is connected to the output of the second OR gate 22 and forth OR gate 25, to received the feedback data signals 44 and 47 from the second OR gate 22 and forth OR gate 25; its output is connected to the chip 10.

Therefore, first use the chip 10 to transmit control signals 31 and 32 and the data signals 41 to the first interfacing unit 11 and second interfacing unit 12. After the logical calculations of the OR gates 21, 22, 23, 24 and 25, the first interfacing unit 11 and second interfacing unit 12 feedback data signals 44 and 47 to the AND gate 23. After the AND gate 23 calculates binary multiplication, the output data 48 is transmitted back to chip 10.

The digital logic of the chip 10 and the first interfacing unit 11 of the invention is described below:

When the chip 10 output a high voltage control signal 31 and a high voltage data signal 41 to the first interfacing unit 11, the first OR gate 21 receives these high voltage signals and performs binary addition on the data to output a high voltage data signal 42 to the first interfacing unit 11. The first interfacing unit 11 then outputs a high voltage data signal 43. The input ends of the second OR gate 22 are connected separately to receive the high voltage control signal 31 from the chip 10 and the high voltage data signal 43 from the first interfacing unit 11; after the binary addition calculation, it feeds back a high voltage data signal 44 to the AND gate 23. Therefore, the data signal 44 is a high voltage signal, so it cannot pass through the AND gate 23 during data transmission.

When the chip 10 outputs a high voltage control signal 31 and a low voltage data signal 41 to the first interfacing unit 11, the inputs of the first OR gate 21 receive a high voltage control signal 31 and a low voltage data signal 41. After binary addition calculation, the OR gate outputs a high voltage data signal 42 to the first interfacing unit 11. The first interfacing unit 11 outputs a high voltage data signal 43. The inputs of the second OR gate 22 are connected separately to receive the high voltage control signal 31 from the chip 10 and the high voltage data signal 43 from the first interfacing unit 11. After binary addition calculation, the OR gate feeds back a high voltage data signal 44 to the AND gate 23. Therefore, data signal 44 is a high voltage signal, so it cannot pass through the AND gate 23 during data transmission.

When the chip 10 outputs a low voltage control signal 31 and a high voltage data signal 41 to the first interfacing unit 11, the inputs of the first OR gate 21 receive a low voltage control signal 31 and a high voltage data signal 41. After binary addition calculation, the OR gate outputs a high voltage data signal 42 to the first interfacing unit 11. The first interfacing unit 11 outputs a high voltage data signal 43. The inputs of the second OR gate 22 are connected separately to receive the low voltage control signal 31 from the chip 10 and the high voltage data signal 43 from the first interfacing unit 11. After binary addition calculation, the OR gate feeds back a high voltage data signal 44 to the AND gate 23. Therefore, data signal 44 is a high voltage signal, so it cannot pass through the AND gate 23 during data transmission.

When the chip 10 outputs a low voltage control signal 31 and a low voltage data signal 41 to the first interfacing unit 11, the inputs of first OR gate 21 receive a low voltage control signal 31 and a low voltage data signal 41. After binary addition calculation, the OR gate outputs a low voltage data signal 42 to the first interfacing unit 11. The first interfacing unit 11 outputs a low voltage data signal 43. The inputs of the second OR gate 22 are connected separately to receive the low voltage control signal 31 from the chip 10 and the low voltage data signal 43 from the first interfacing unit 11. After binary addition calculation, the OR gate feeds back a low voltage data signal 44 to the AND gate 23. Therefore, data signal 44 is a low voltage signal, so it can pass through the AND gate 23 during data transmission.

Therefore, the chip 10 can only transmit data with the first interfacing unit 11 when the chip 10 outputs a low voltage control signal 11 and low voltage data signal 41.

The digital logic between the chip 10 and the second interfacing unit 12 is the same as the digital logic between the chip 10 and first interfacing unit 11, so it is not repeated here.

Therefore, if the chip 10 needs to transmit data with the second interfacing unit 12, it needs to output low voltage data signals 41 to the first OR gate 21 and the third OR gate 24, output high voltage data signals 31 to first and second OR gates 21 and 22, and low voltage control signals 32 to third and forth OR gates 24 and 25. The inputs of the first OR gate 21 receive the high voltage control signal 31 and low voltage data signal 41; after binary addition calculation, a high voltage data signal 42 is output to the first interfacing unit 11. The first interfacing unit 11 then outputs a high voltage data signal 43. The inputs of the second OR gate 22 are connected to receive the high voltage control signal 31 from the chip 10 and the high voltage data signal 43; after binary addition calculation, it feeds back a high voltage data signal 44 to the AND gate 23. Also, the inputs of the third OR gate 24 receive the low voltage control signal 32 and low voltage data signal 41; after binary addition calculation, it outputs a low voltage data signal 45 to the second interfacing unit 12. The second interfacing unit 12 outputs a low voltage data signal 46. The inputs of forth OR gate 25 receive the low voltage control signal 32 from the chip 10 and the low data signal 46 from second interfacing unit 12. After binary addition calculation, the OR gate 25 feeds back a low voltage data signal 47 to the AND gate 23. The AND gate 23 performs the binary multiplication calculation using the inputted high voltage data signal 44 and low voltage data signal 47 and outputs a low voltage data signal 48. The chip 10 can execute data transmission with the second interfacing unit 12.

Figure 2:
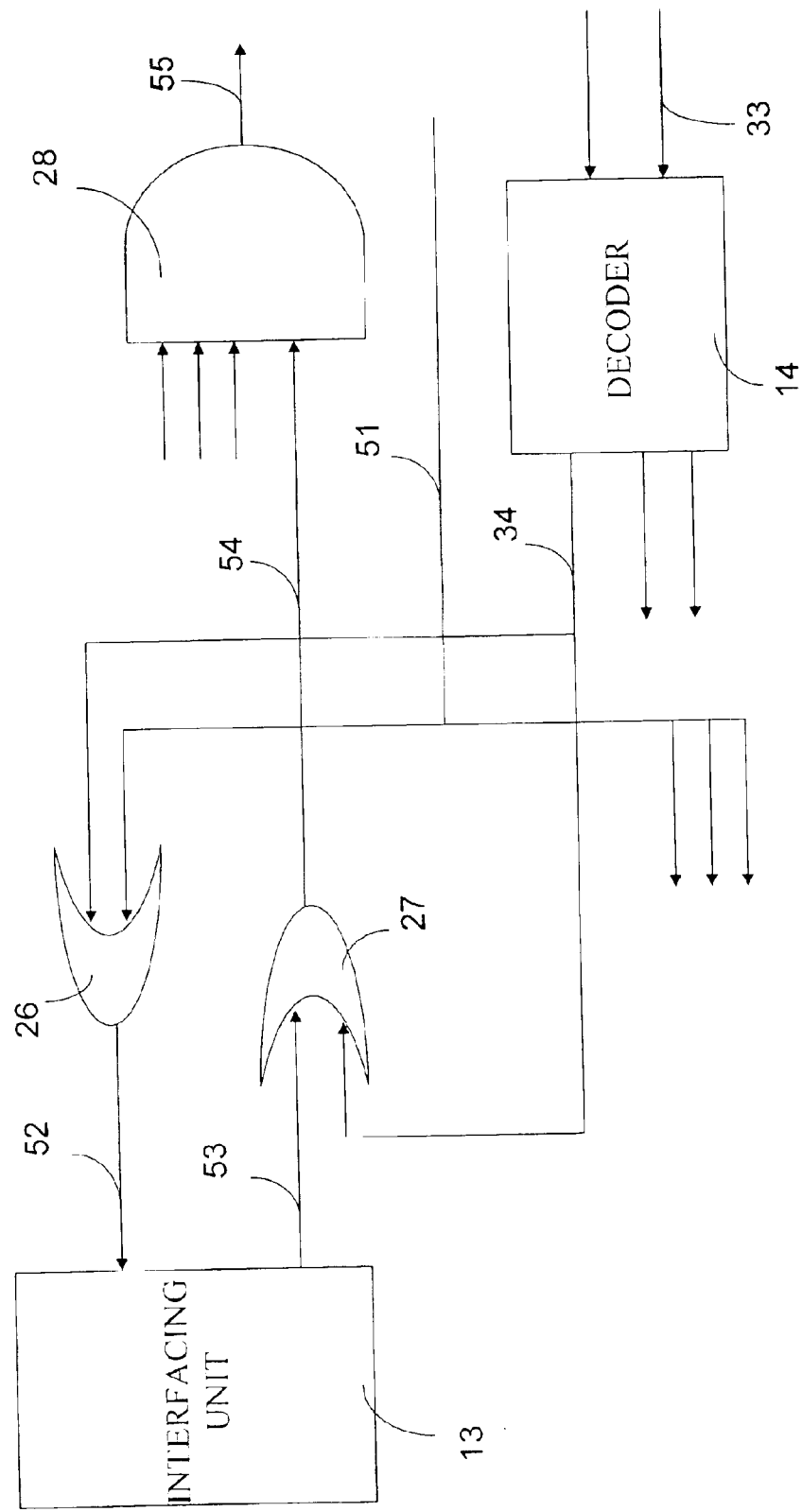
FIG. 2 illustrates the partial electrical circuit of an example of the invention in block diagram form.

Please refer to FIG. 2 for the illustration of the partial electrical circuit block diagram of the invention. As shown in the figure, when the chip (not in the picture) is connected to more than two interfacing units 13, a decoder 14 can be connected to the chip so that the control signal 33 from the chip is first decoded by the decoder 14 before outputting to each OR gate 26 and 27. This can solve the problem of insufficient pins on the chip, which limits the number of the connected interfacing units.

Therefore, when the chip 10 transmits data to a particular interfacing unit 13, it first outputs a control signal 33 to the decoder 14 and a low voltage data signal 51 to the first OR gate 16. After the decoder decodes the signal, it outputs a low voltage control signal 34 to the second OR gate 27 and the first OR gate corresponding to the chosen interfacing unit. The first OR gate 26 receives the low voltage control signal 34 from the decoder 14 and the low voltage data signal 51 from the chip. After binary addition calculation, the OR gate outputs a low voltage data signal 52 to the interfacing unit 13. The interfacing unit 13 outputs a low voltage data signal 53 to the second OR gate 27. The inputs of the second OR gate 27 receive the low voltage data signal 53 from the interfacing unit 13 and the low voltage control signal 34 from the decoder. After binary addition calculation, the OR gate feeds back a low voltage data signal 54 to the AND gate 28. After the logic calculation, the AND gate outputs low voltage data signals 55 back to the chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An expending module for serial transmission, which receives a control signal and a data signal from a chip for data transmission, comprising:

a plurality of interfacing units, which are integrated circuits that converts serial interface to other transmission formats;

a plurality of first OR gates corresponding to the interfacing units, the inputs of the first OR gates connected to the chip to receive control and data signals, which output a data signal to the corresponding interfacing unit;

a plurality of second OR gates corresponding to the interfacing units, the inputs of the second OR gates connected to the chip to receive control signal and the corresponding units to receive data signal, which output and data signal; and an AND gate with inputs connected to the second OR gates to receive data signal from the second OR gates and outputs a data signal to the chip.

2. The expending module for serial transmission in claim 1, wherein the chip outputs a low voltage data signal and a low voltage control signal to the interfacing unit, which signals are received by the input of the first OR gate corresponding to the interfacing unit, after logic calculation, a low voltage data signal is output to the interfacing unit which outputs a low voltage data signal to the second OR gate receiving the low voltage data signal and low voltage control signal, after logic calculation, a low voltage data signal is sent to the AND gate which executes logic calculation and outputs back to the chip.

3. The expending module for serial transmission in claim 1, wherein the interfacing units are serial interface converting integrated circuits of different formats.

4. The expending module for serial transmission in claim 1, wherein the interfacing unit is a serial to parallel interfacing integrated circuit.

5. The expending module for serial transmission in claim 1, wherein the interfacing unit is a serial to USB integrated circuits.

6. The expending module for serial transmission in claim 1, wherein said that it is a serial to Ethernet integrated circuits.

7. The expending module for serial transmission in claim 1, wherein the serial interface is one selected from the group consisting of RS232, RS422 and RS485.

8. The expending module for serial transmission in claim 1, wherein the control signal from the chip first passes through a decoder and then delivered to the first or second OR gate.

* * * * *